United States Patent
van Sprakelaar

(10) Patent No.: US 7,388,432 B1
(45) Date of Patent: Jun. 17, 2008

(54) CURRENT FEEDBACK AMPLIFIER WITH EXTENDED COMMON MODE INPUT RANGE

(75) Inventor: Gert Jan van Sprakelaar, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/180,948

(22) Filed: Jul. 12, 2005

(51) Int. Cl.
    *H03F 3/45* (2006.01)
(52) U.S. Cl. .................... 330/257; 330/258
(58) Field of Classification Search .......... 330/252–261
    See application file for complete search history.

(56) References Cited

U.S. PATENT DOCUMENTS

| 4,555,673 | A | 11/1985 | Huijsing et al. | ............. | 330/258 |
| 7,132,860 | B2 * | 11/2006 | Lehto | ......................... | 327/52 |
| 2006/0267687 | A1 * | 11/2006 | Gammie et al. | ............. | 330/260 |

OTHER PUBLICATIONS

Robert J. Widlar, "Low Voltage Techniques," *IEEE*, Dec. 1978 (9 pgs).
Doug Smith et al., "Evolution of High-Speed Operational Amplifier Architectures," *IEEE*, Oct. 1994 (14 pgs).
Derek F. Bowers et al., "Recent Developments in Bipolar Operational Amplifiers," *IEEE*, 1999 (8 pgs).
Ivan Koudar, "Variable Gain Differential Current Feedback Amplifier," *IEEE 2004 Custom Integrated Circuits Conference*, 2004 (4 pgs).
Jeff Lies et al., "An Intuitive Approach To Current-Feedback Amplifiers", *Electronic Design Analog Applications Issue*, Nov. 17, 1997 (5 pgs).

* cited by examiner

*Primary Examiner*—Robert Pascal
*Assistant Examiner*—Hieu Nguyen
(74) *Attorney, Agent, or Firm*—Brett A. Hertzberg; Merchant & Gould PC

(57) ABSTRACT

A Current Feedback Amplifier (CFA) is arranged to receive an input signal having a common mode (CM) range that is greater than the voltage across the supply rails. The CFA contains a rail-to-rail output stage that is configured to output an output signal in response to the common mode input signal.

21 Claims, 10 Drawing Sheets

CURRENT FEEDBACK AMPLIFIER WITH EXTENDED COMMON MODE INPUT RANGE

FIELD OF THE INVENTION

The present disclosure generally relates to current feedback amplifiers (CFAs). More particularly, the present disclosure relates to a CFA topology having an input common mode voltage range (CMVR) that extends beyond the supply rail voltage of the CFA.

BACKGROUND

Current feedback amplifiers (CFAs) are now widely used in a number of high speed applications because of the performance characteristics of the CFAs. However, one drawback of the traditional CFA topology is the poor input common mode voltage range (CMVR), which usually limits their application to a relatively high supply voltage (which is typically five volts in conventional voltage feedback amplifiers).

BRIEF DESCRIPTION OF THE DRAWINGS

Non-limiting and non-exhaustive embodiments are described with reference to the following drawings.

DETAILED DESCRIPTION

Figure 1:
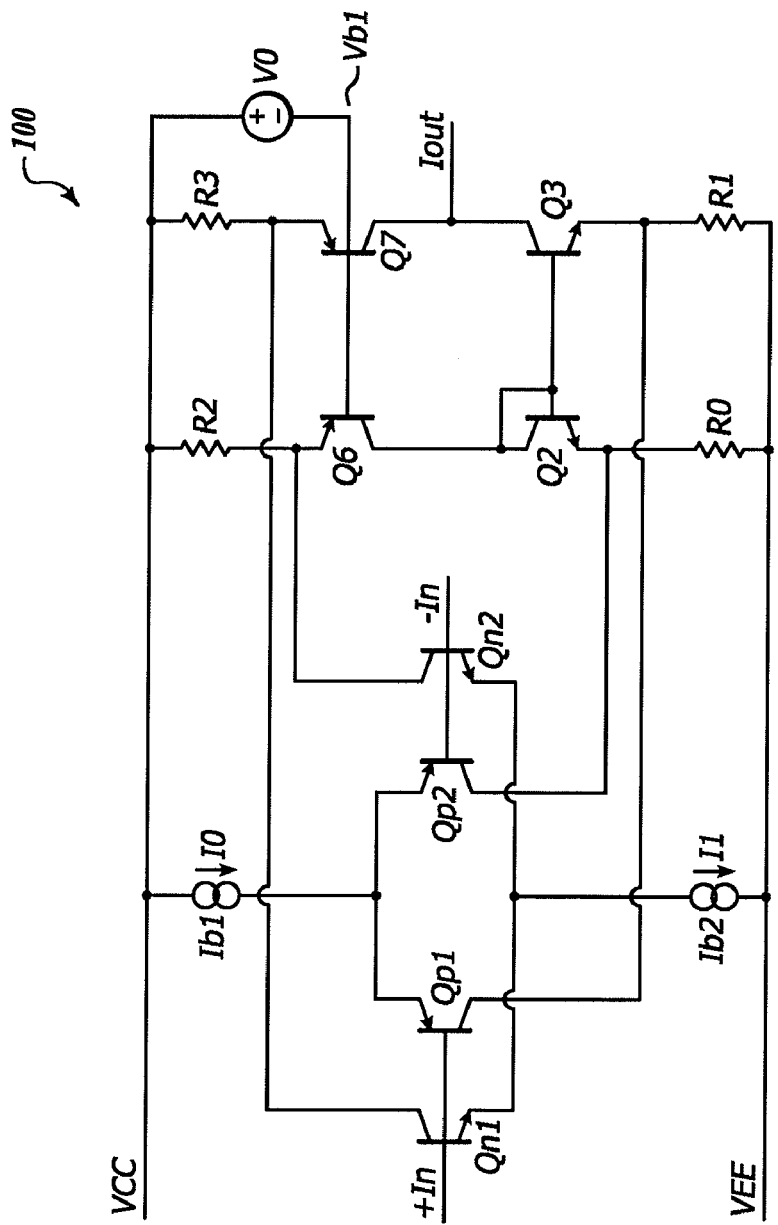
FIG. 1 is a schematic diagram of a conventional voltage feedback amplifier having a rail-to-rail input circuit.

Various embodiments will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. The meaning of "in" may include "in" and "on." The term "connected" may mean a direct electrical, electromagnetic, mechanical, logical, or other connection between the items connected, without any electrical, mechanical, logical or other intermediary therebetween. The term "coupled" can mean a direct connection between items, an indirect connection through one or more intermediaries, or communication between items in a manner that may not constitute a connection. The term "circuit" can mean a single component or a plurality of components, active and/or passive, discrete or integrated, that are coupled together to provide a desired function. The term "signal" can mean at least one current, voltage, charge, data, or other such identifiable quantity Briefly stated, the present disclosure generally relates to a Current Feedback Amplifier (CFA) that is arranged to receive an input signal have a common mode (CM) range that is greater than the voltage across the supply rails. The common mode input voltage is sensed by a current feedback input stage and operates in response to a signal provided by one of a current feedback core, a first voltage feedback amplifier, and a second voltage feedback amplifier that is different from the first voltage feedback amplifier. The first and second voltage feedback amplifiers typically do not consume power until the input signal approaches the voltage of one of the supply rails.

Conventional Art

Conventional voltage feedback amplifiers (VFA) can achieve rail-to-rail common mode input voltages by using two input stages in parallel. One stage can receive inputs having voltages as high as the positive supply rail (voltage), while the other stage can receive inputs having voltages as low as the negative rail.

FIG. 1 is a schematic diagram of a conventional voltage feedback amplifier having a rail-to-rail input circuit (100). VFA 100 includes transistors Qn1, Qp1, Qp2, Qn2, Q2, Q3, Q6, Q7, current source 10, current sink 11, and resistors R0, R1, R2, and R3. Transistors Qn1, Qp1, Qp2, and Qn2 form two emitter-coupled transistor pairs that are connected in parallel to a common mode (CM) input. The NPN transistor pair (Qn1 and Qn2) can reach the VCC rail (i.e., the "high"-side supply voltage) when the voltage drop across resistors R2 and R3 is insubstantial. Similarly, the PNP transistor pair (Qp1 and Qp2) can reach the negative rail when the voltage drop across resistors R0 and R1 is insubstantial. Transistors Q2, Q3, Q6, and Q7, form a folded cascode amplifier that provides a summing function for an output current that can drive an output stage.

The transconductance (Gm) of both transistor pairs contributes to the output current when both transistor pairs are operating. When only one of the pairs is operating, only one pair contributes to the output current. When only one of the pairs is operating, the Gm is effectively reduced by half of the total value. This reduction in transconductance typically leads to sub-optimal frequency compensation because the amplifier bandwidth decreases in proportion to the Gm.

Figure 2:
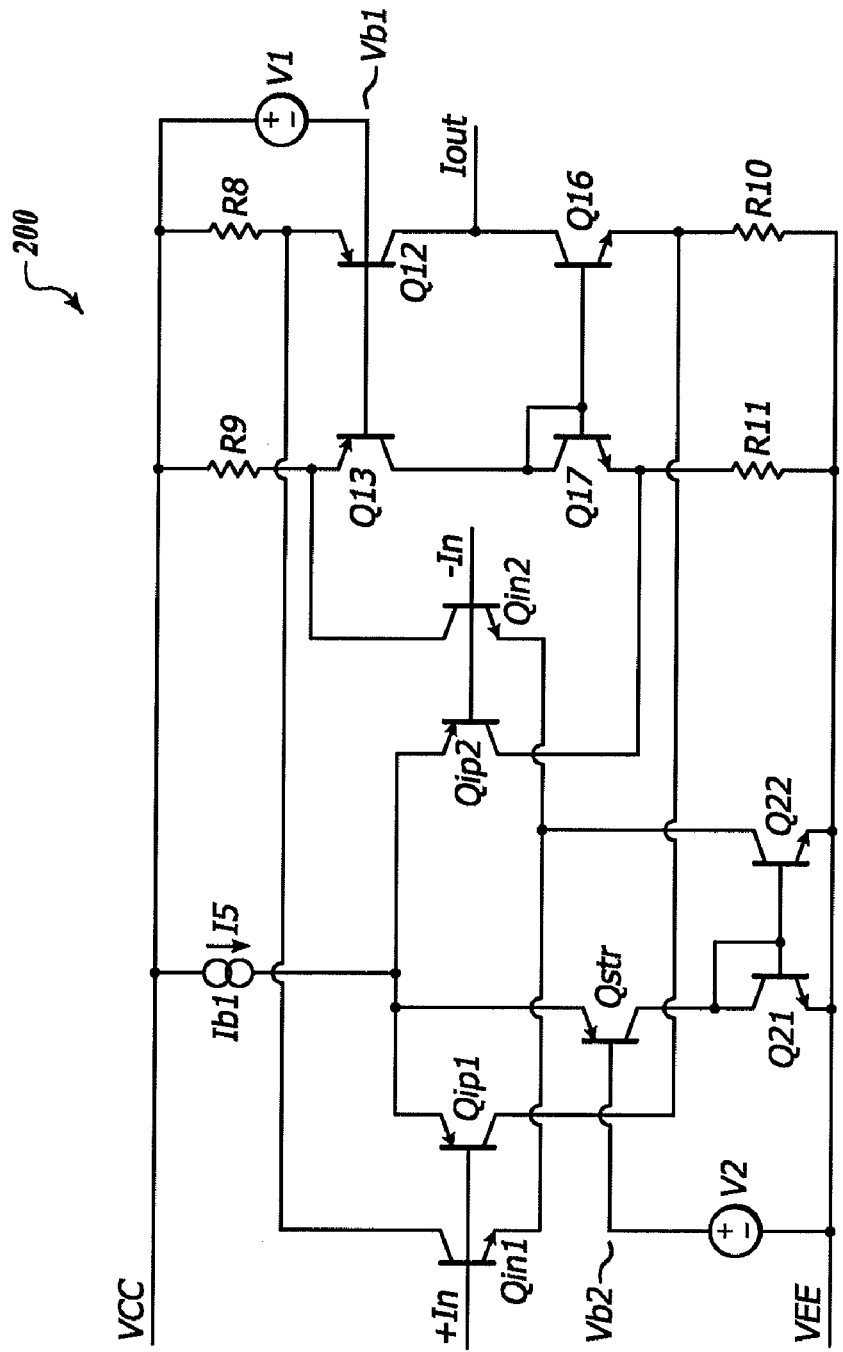
FIG. 2 is a schematic diagram of an improved conventional voltage feedback amplifier having a rail-to-rail input circuit.

FIG. 2 is a schematic diagram of an improved conventional voltage feedback amplifier having a rail-to-rail input circuit (200). VFA 200 includes transistors Qin1, Qip1, Qip2, Qin2, Qstr, Q21, Q22, Q12, Q13, Q16, Q17, current source 15, and resistors R10, R11, R8, and R9.

When the CM voltage at the input of VFA 200 is higher than Vb2+60 millivolts, the NPN transistor pair Qin1 and Qin2 are arranged to conduct a current. The current flows through a path defined by the current source 15, transistor Qstr, and the current mirror formed by transistors Q21 and Q22. As the CM voltage of the input signal decreases to around Vb2+60 millivolts, the input PNP transistor pair starts to turn on, which removes current from the NPN pair. When the CM voltage decreases to below Vb2-60 millivolts, substantially all the current from I5 routed through the PNP transistor pair. The sum of the emitter currents through the NPN and PNP pair is thus kept constant, which results in a constant proportion of Gm to the CM voltage.

Figure 3:
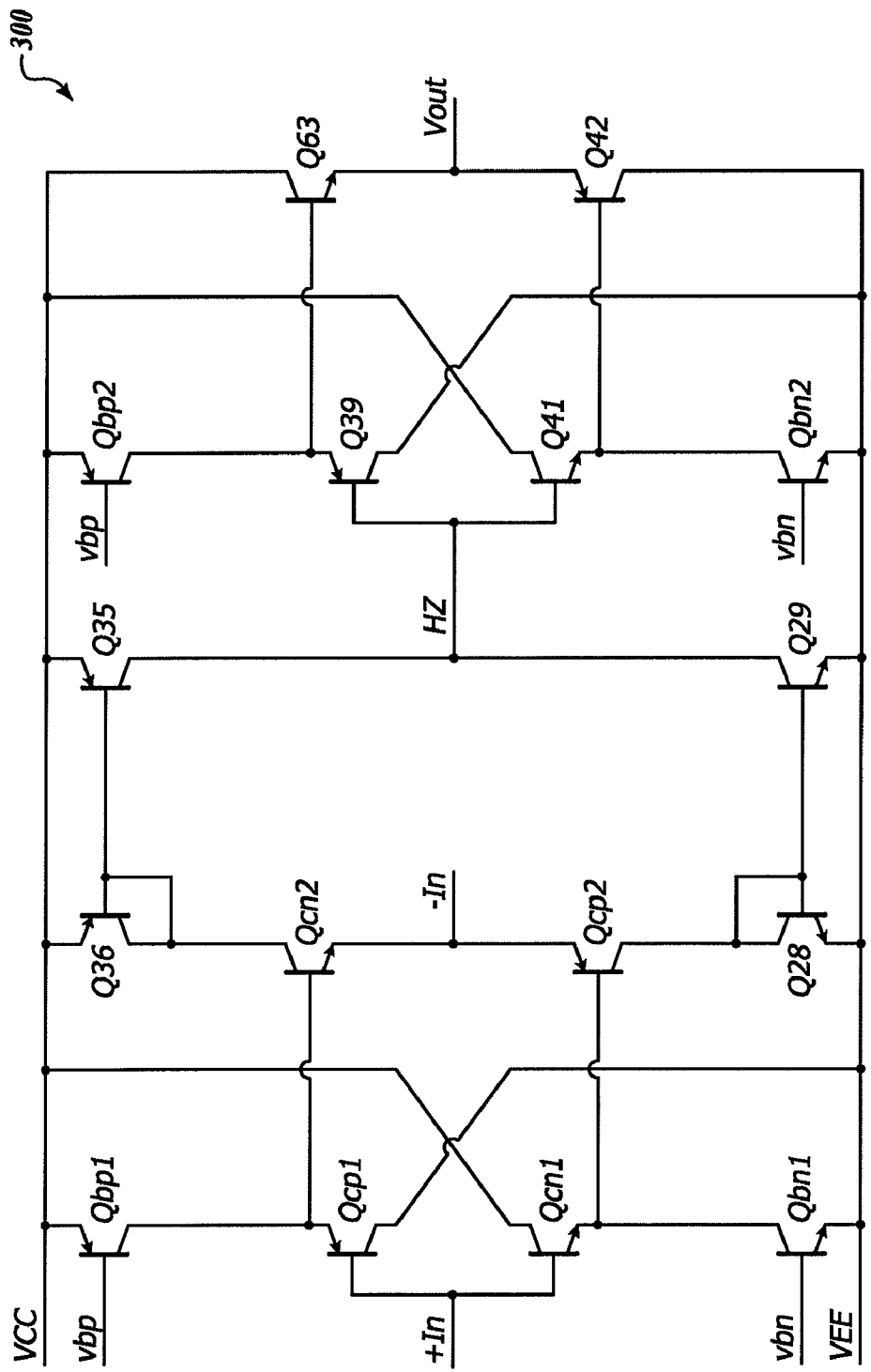
FIG. 3 is a schematic diagram of a conventional current feedback amplifier.

FIG. 3 is a schematic diagram of a conventional current feedback amplifier (300). CFA 300 includes transistors Qbp1, Qcp1, Qcn1, Qbn1, Qcn2, Qcp2, Q28 Q29, Q35, Q36, Qbp2, Qbn2, Q39, Q41, Q42, and Q63. Conventional CFAs typically have a limited common mode voltage range (CMVR). The CMVR is typically limited to a voltage that is defined by at least two base-emitter voltages (Vbe) and two saturation voltages (Vsat). The amplifier also includes a basic emitter-follower output stage.

General System Concept

Figure 4:
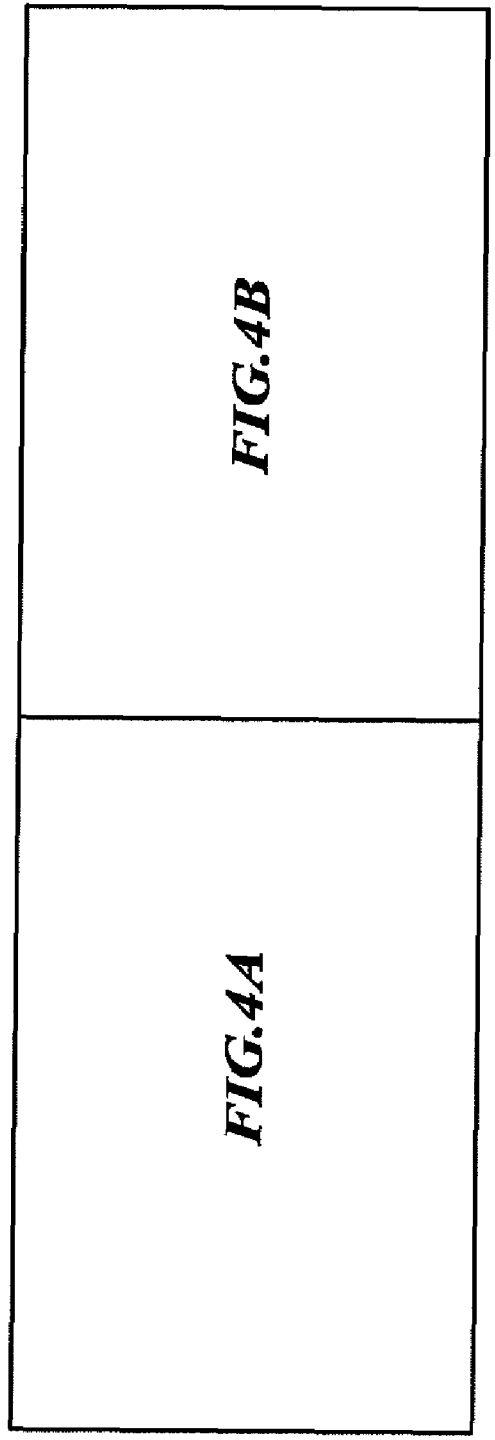
FIG. 4 is a plan view of a schematic diagram of an example current feedback amplifier having an extended CM input range.
Figure 4A:
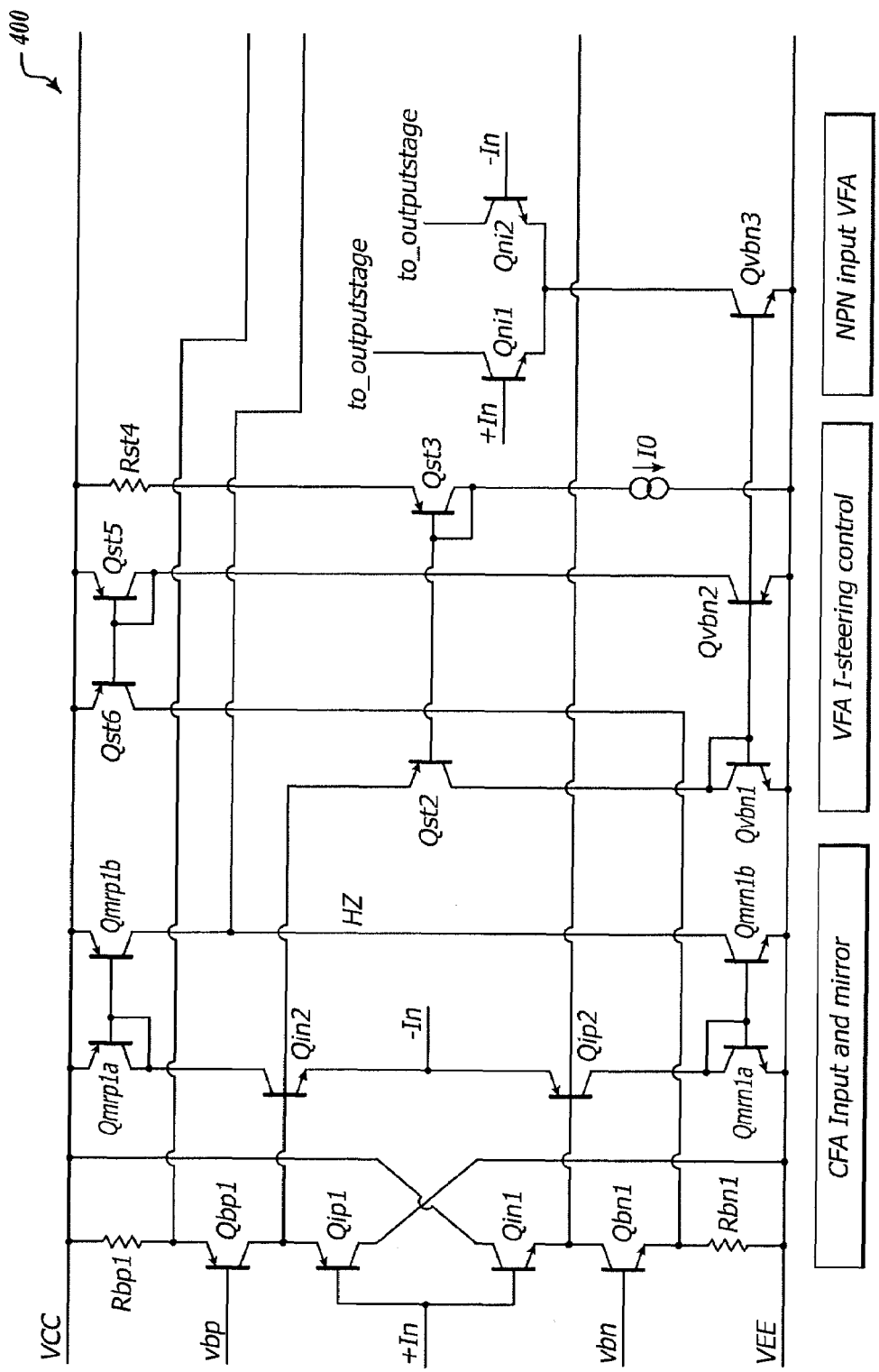
FIG. 4A is the first portion of the schematic diagram of the example current feedback amplifier having an extended CM input range.
Figure 4B:
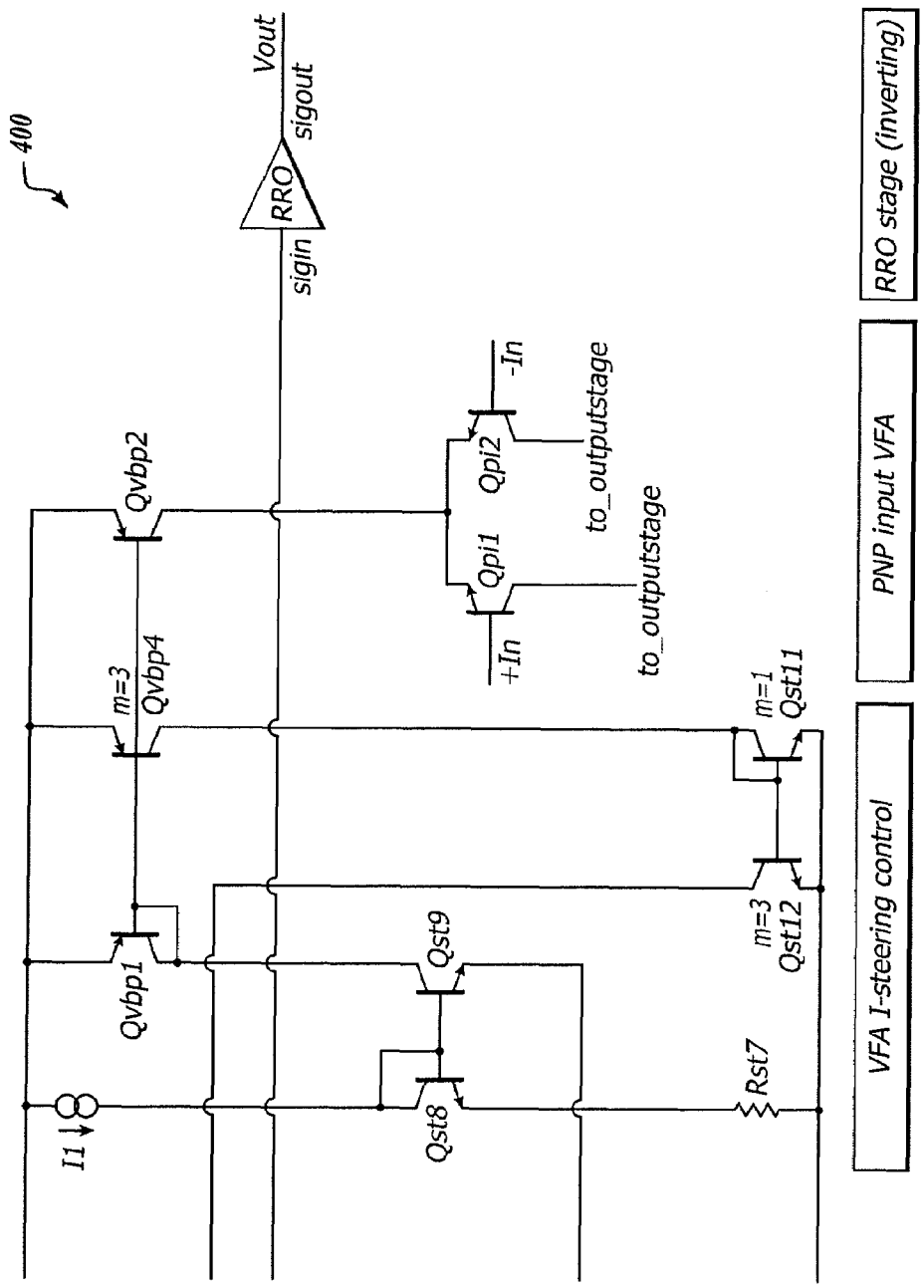
FIG. 4B is the second portion of the schematic diagram of the example current feedback amplifier having an extended CM input range.

FIG. 4 is a plan view of a schematic diagram of an example current feedback amplifier having an extended CM input range (400). FIG. 4A is the first portion of the schematic diagram of the example current feedback amplifier having an extended CM input range. FIG. 4B is the second portion of the schematic diagram of the example current feedback amplifier having an extended CM input range. CFA 400 includes transistors Qbp1, Qip1, Qin1, Qbn1, Qin2, Qip2, Qmrp1a, Qmrp1b, Qmrn1a, Qqmrn1b, Qst2, Qst3, Qst5, Qst6, Qvbn1, Qvbn2, Qvbn3, Qni1, Qni2, Qst8, Qst9, Qst11, Qstl2, Qvbp1, Qvbp4, Qvbp2, Qpi1, Qpi2, resistors Rbp1, Rbn1, Rst4, Rst7, current source 11, current sink 13, and output stage RRO.

As shown in the figures, the CM inputs of two voltage feedback amplifiers are coupled in parallel with the CM inputs of a current feedback amplifier CFA input. This topology allows the CFA (working in conjunction with the two VFAs) to operate in a continuous voltage range that is between and beyond the supply rails. Additional circuitry (described below) has been added to ensure proper signal transferring between the three stages.

Three ranges of operation are described:

1. an intermediate range (normal operation), where the CFA is active;

2. a negative range, where the input common mode is from the negative supply VEE to VEE+Vbe+Vref, and where the NPN VFA is active; and 3. a positive range, where the input common mode is from the positive supply VCC to VCC-Vbe-Vref, and where the PNP VFA is active.

In operation, a CM voltage is applied to the inputs of the amplifiers (nodes +In and −In). When the CM voltage is between VEE and VCC, the CFA is active and the current from the bias sources Qbn1 and Qbp1 flows into the input stage of the CFA (Qin1, Qin2, Qip1 and Qip2). In this mode, the current steering stages and the NPN and PNP VFAs are off (i.e., typically drawing no or little current).

When CM voltages of the inputs approach the negative rail, the emitter voltage of Qin1 (which is the CM voltage-Vbe) is compared against the emitter voltage of Qst8 (which is generated by current sink 11 and resistor Rst7). When the CM voltage reaches a voltage around VEE+Vbe+100 millivolts, the current from bias source Qbn1 begins to be steered away from the CFA into Qst9. The current is reflected via current mirror Qvbp1 to Qvbp2, where it is applied as the tail current for the PNP folded cascode stage (at transistors Qpi1 and Qpi2).

Likewise, the current is also mirrored into Qvbp4 via the current mirror Qst11, 12, such that the applied current starts to turn off the PNP bias source Qbp1. As the CM voltage is decreased further, more current is steered away such that when the CM voltage reaches a voltage around VEE+Vbe−25 millivolts, substantially all the current is diverted from the CFA into Qst9. At that point, the CFA is substantially off and the PNP VFA conducts all input signals. Because the example VFA is a conventional folded cascode input stage, the example VFA can easily handle input signals that range from VEE to hundreds of millivolts below VEE.

The NPN VFA is activated in a similar fashion, and can conduct input signals near to a few hundreds of millivolts above VCC. When CM voltages approach the positive rail, the emitter voltage of Qip1 is compared against the emitter voltage of Qst3 (which is generated by current sink 13 and resistor Rst4). When the CM voltage reaches a voltage around VCC−Vbe−100 millivolts, the current from bias source Qbp1 begins to be steered away from the CFA into Qst2. The current is reflected via current mirror Qvbn1 to Qvbn3, where it is applied as the tail current for the NPN folded cascode stage (at transistors Qni1 and Qni2).

Likewise, the current is also mirrored into Qvbn2 via the current mirror Qst5, Qst6, such that the applied current starts to turn off the NPN bias source Qbn1. As the CM voltage is decreased further, more current is steered away such that when the CM voltage reaches a voltage around VCC−Vbe+25 millivolts, substantially all the current is diverted from the CFA into Qst2. At that point, the CFA is substantially off and the NPN VFA conducts all input signals.

Figure 5A:
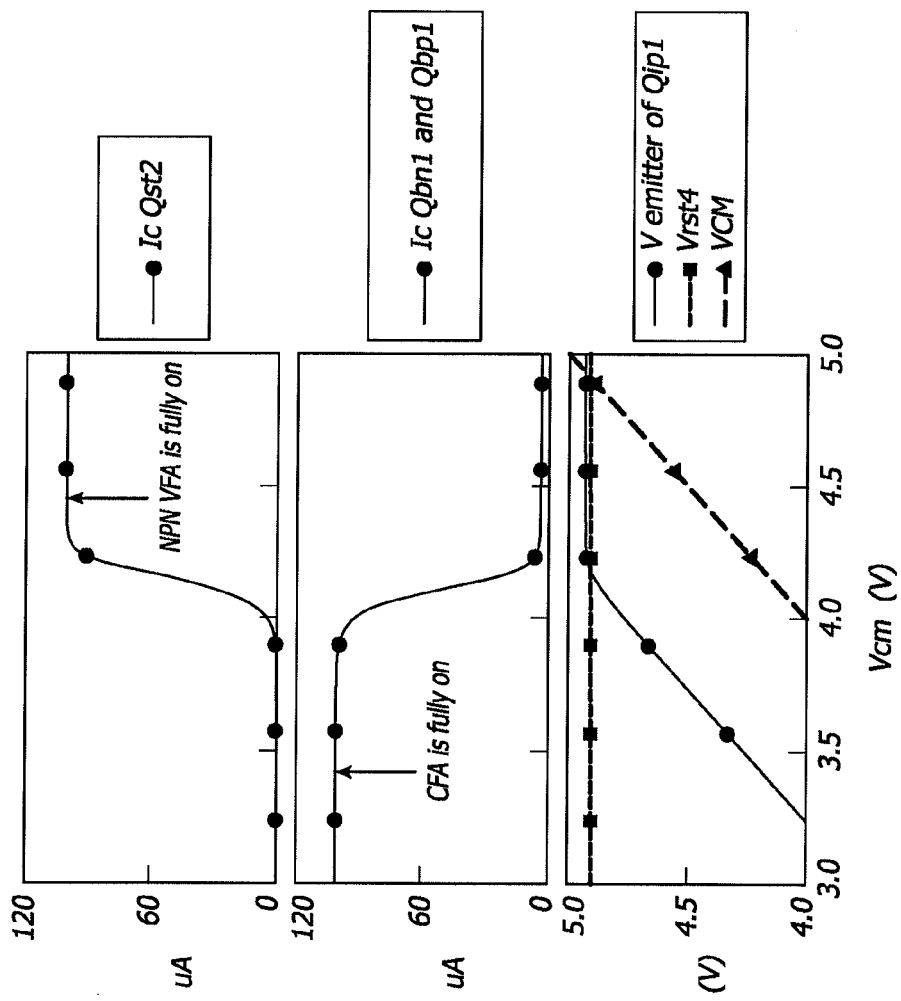
FIG. 5A is a signal graph showing a crossover point of the example CFA and the example NPN VFA.

FIG. 5A is a signal graph showing a crossover point of the example CFA and the example NPN VFA. The absolute value of the collector currents in the biasing sources are shown with the current steering stages being a function of the CM voltage.

Figure 5B:
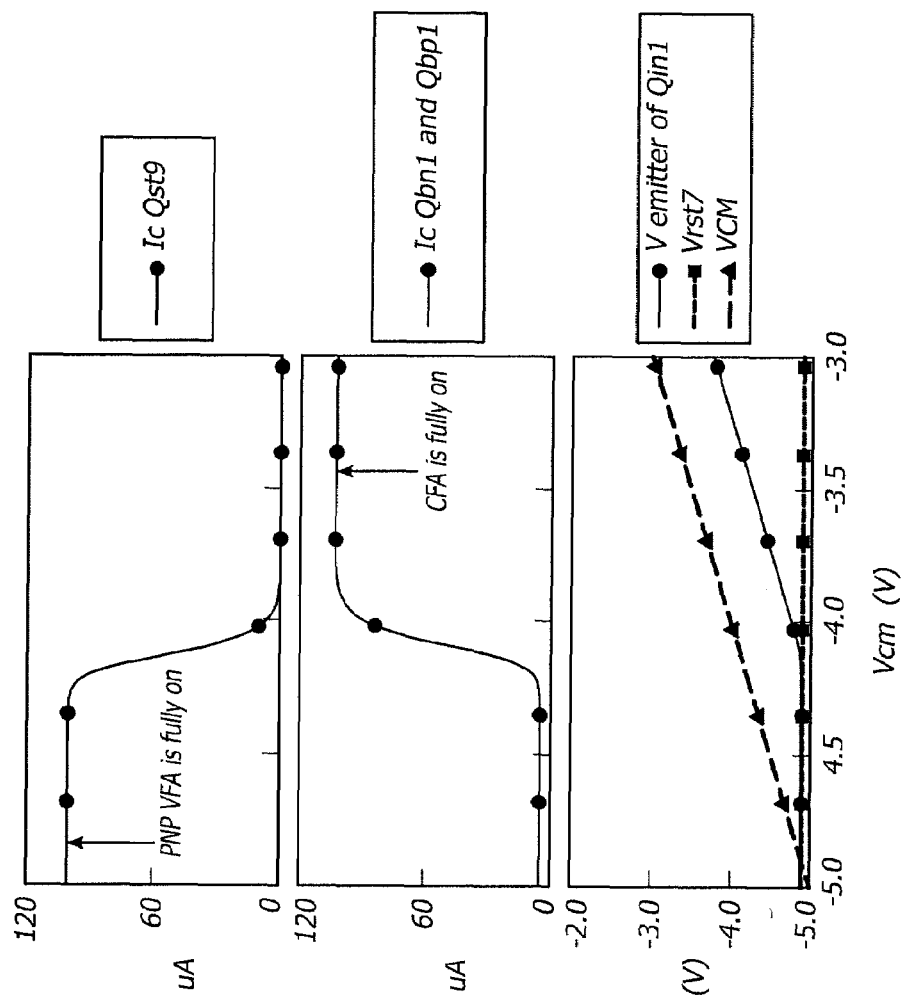
FIG. 5B is a signal graph showing a crossover point of the example CFA and the example PNP VFA.

FIG. 5B is a signal graph showing a crossover point of the example CFA and the example PNP VFA. The absolute value of the collector currents in the biasing sources are shown with the current steering stages being a function of the CM voltage.

Figure 6:
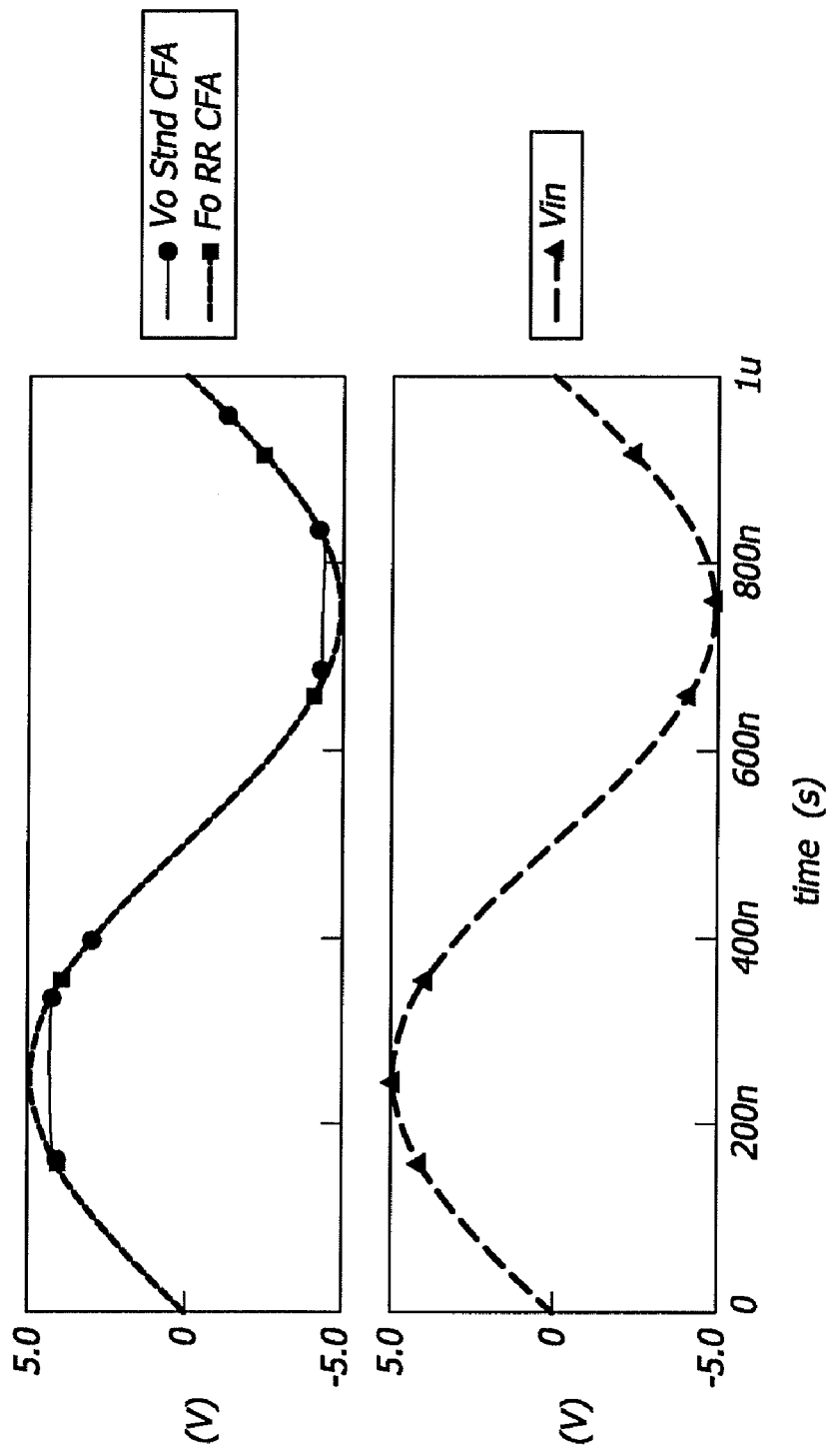
FIG. 6 is a signal graph showing the output response of an example CFA with an extended input range in comparison with a conventional CFA output response.

FIG. 6 is a signal graph showing the output response of an example CFA with an extended input range in comparison with a conventional CFA output response. The output voltage of the example extended input range CFA can follow the input voltage to within a few tens of millivolts and is limited by how far the rail-to-rail output stage (RRO) can swing.

Figure 7:
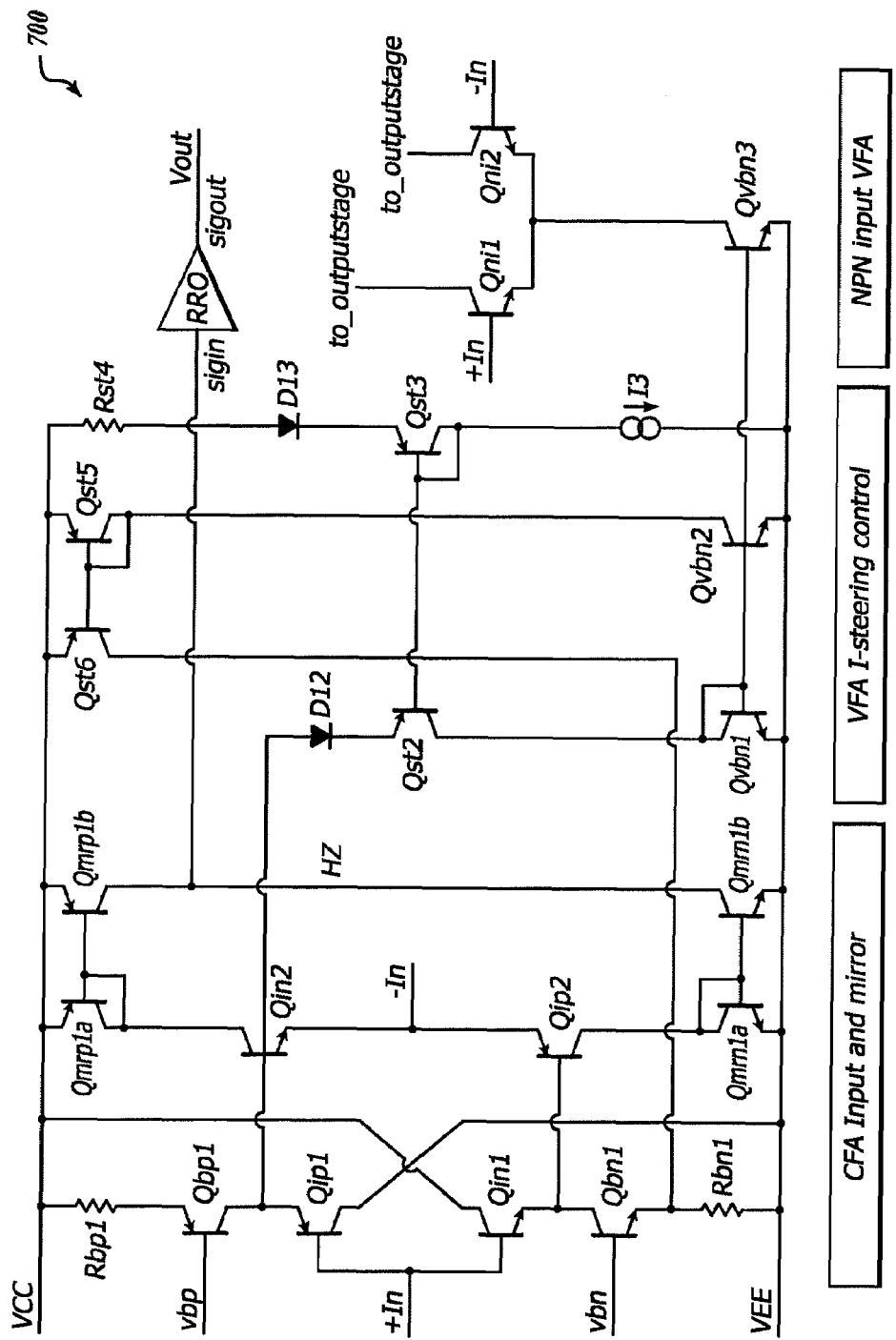
FIG. 7 is an example extended input range CFA having diode protection.

FIG. 7 is an example extended input range CFA having diode protection. CFA 700 includes transistors Qbp1, Qip1, Qin1, Qbn1, Qin2, Qip2, Qmrp1a, Qmrp1b, Qmrn1a, Qqmrn1b, Qst2, Qst3, Qst5, Qst6, Qvbn1, Qvbn2, Qvbn3, Qni1, Qni2, resistors Rbp1, Rbn1, Rst4, current sink 13, diodes D12 and D13, and output stage RR0.

In operation, example extended input range CFA 700 works when the Vbe of Qst2 and Qst9 are operated below the reverse emitter breakdown voltage. In advanced complementary bipolar processes, Qst2 and Qst9 should be protected because of a relatively low breakdown voltage. For example, diodes D12 and D13 are shown as being added to protect Qst2. Similar diodes can be added to protect Qst5 as well. In operation, the overall current steering remains substantially the same when the diodes are used. The CMVR is still beyond the voltage rails because, for example, the diode voltage drop in D13 negates the diode drop in D12.

The example extended input range CFA input stage using parallel VFA stages typically shows exemplary performance when the offset voltages of the three stages are well matched (for example, by using good layout practices). However, certain transistors may require individual trimming of their offset voltages to minimize any glitches during transition periods.

Although the invention has been described herein by way of exemplary embodiments, variations in the structures and methods described herein may be made without departing from the spirit and scope of the invention. For example, the positioning and/or sizing of the various components may be varied. Individual components and arrangements of components may be substituted as known to the art. Since many embodiments of the invention can be made without departing from the spirit and scope of the invention, the invention is not limited except as by the appended claims.

What is claimed is:

1. A current feedback amplifier, comprising:
   first and second power input terminals that are configured to receive a rail-to-rail voltage for powering the current feedback amplifier;
   an input that is configured to receive an input signal that includes a common mode input signal and a differential signal, wherein the common mode input signal has a voltage magnitude that is greater than one of voltages of the first and second input terminals; and
   a current feedback input stage that operates in response to a signal provided by one of the input, a first voltage feedback amplifier, and a second voltage feedback amplifier that is different from the first voltage feedback amplifier; and
   a rail-to-rail output stage that is configured to output an output signal in response to the differential signal.

2. The apparatus of claim 1, wherein the first input voltage feedback amplifier is an NPN VFA.

3. The apparatus of claim 2, wherein the first input voltage feedback amplifier operates when the common mode input signal is within a Vbe of a voltage of that is provided to the first power input terminal.

4. The apparatus of claim 1, wherein the second input voltage feedback amplifier is a PNP VFA.

5. The apparatus of claim 4, wherein the second input voltage feedback amplifier operates when the common mode input signal is within a Vbe of a voltage of that is provided to the second power input terminal.

6. The apparatus of claim 1, further comprising a current mirror that is configured to steer current away from the current feedback input stage when the common mode input signal is within a Vbe of a voltage of that is provided to the second power input terminal.

7. The apparatus of claim 6, further comprising using diodes to protect transistors associated with the current mirror.

8. A method for amplifying, comprising:
   receiving a rail-to-rail voltage at a first and a second power input terminal, wherein the first and second power input terminals are configured to power an amplifier;
   receiving an input signal at an input of the amplifier that includes a common mode input signal and a differential signal, wherein the common mode input signal has a voltage magnitude that is greater than the magnitude of the rail-to-rail voltage;
   operating a current feedback input stage for the amplifier in response to a signal provided by one of the input, a first voltage feedback amplifier, and a second voltage feedback amplifier that is different from the first voltage feedback amplifier; and
   generating an output signal in response to the differential signal, wherein the output signal is responsive to the input signal over an extended common mode input range that is greater than the magnitude of the rail-to-rail voltage.

9. The method of claim 8, wherein the first input voltage feedback amplifier is an NPN VFA.

10. The method of claim 9, wherein the first input voltage feedback amplifier operates when the common mode input signal is within a Vbe of a voltage of that is provided to the first power input terminal.

11. The method of claim 8, wherein the second input voltage feedback amplifier is a PNP VFA.

12. The method of claim 11, wherein the second input voltage feedback amplifier operates when the common mode input signal is within a Vbe of a voltage of that is provided to the second power input terminal.

13. The method of claim 8, further comprising steering current away from the current feedback input stage when the common mode input signal is within a Vbe of a voltage of that is provided to the second power input terminal.

14. An amplifier, comprising:
    a means for receiving a rail-to-rail voltage at a first and a second power input terminal, wherein the first and second power input terminals are configured to power an amplifier;
    a means for receiving an input signal that includes a common mode input signal and a differential signal, wherein the common mode input signal has a voltage magnitude that is greater than the magnitude of the rail-to-rail voltage;
    a current feedback input means that is configured to operate in response to a signal provided by one of the means for receiving the input signal, a first voltage feedback amplifier means, and a second voltage feedback amplifier means that is different from the first voltage feedback amplifier means; and
    a means for generating an output signal in response to the differential signal whereby the amplifier has an extended common mode input range that is greater than the magnitude of the rail-to-rail voltage.

15. The amplifier of claim 14, wherein the first input voltage feedback amplifier means comprises an NPN VFA.

16. The amplifier of claim 14, further comprising a means for steering current away from the current feedback input means when the common mode input signal is within a Vbe of a voltage of that is provided to the second power input terminal.

17. The amplifier of claim 16, further comprising using diode means to protect the means for steering current away from the current feedback core means.

18. The apparatus of claim 1, wherein the first input voltage feedback amplifier operates when the common mode input signal is within a Vbe of a voltage of that is provided to the first power input terminal.

19. The method of claim 8, further comprising steering current away from the current feedback input stage when the common mode input signal is within a Vbe of a voltage of that is provided to the first power input terminal.

20. The amplifier of claim 14, wherein the second input voltage feedback amplifier means comprises a PNP VFA.

21. The amplifier of claim 14, further comprising a means for steering current away from the current feedback input means when the common mode input signal is within a Vbe of a voltage of that is provided to the first power input terminal.

* * * * *

UNITED STATES PATENT AND TRADEMARK OFFICE
CERTIFICATE OF CORRECTION

PATENT NO. : 7,388,432 B1
APPLICATION NO. : 11/180948
DATED : June 17, 2008
INVENTOR(S) : Gert Jan van Sprakelaar It is certified that error appears in the above-identified patent and that said Letters Patent is hereby corrected as shown below:

Column 2, Line 37: "source 10," should read --source I0--

Column 2, Line 37: "sink 11," should read --sink I1--

Column 2, Line 60: "source 15," should read --source I5--

Column 2, Line 65: "source 15," should read --source I5--

Column 3, Line 28: "Qsl2," should read --Qs12--

Column 3, Line 30: "source 11," should read --source I1--

Column 3, Line 30: "sink 13," should read --sink I3--

Column 3, Line 58: "sink 11," should read --sink I1--

Column 4, Line 13: "sink 13," should read --sink I3--

Column 4, Line 46: "sink 13," should read --sink I3--

Column 4, Line 47: "stage RR0," should read --stage RRO--

Signed and Sealed this

Fourteenth Day of April, 2009

JOHN DOLL
*Acting Director of the United States Patent and Trademark Office*